(12) United States Patent
Chang

(10) Patent No.: US 7,245,687 B2
(45) Date of Patent: Jul. 17, 2007

(54) DIGITAL PHASE-LOCKED LOOP DEVICE FOR SYNCHRONIZING SIGNAL AND METHOD FOR GENERATING STABLE SYNCHRONOUS SIGNAL

(75) Inventor: Chris Chang, Taipei (TW)

(73) Assignee: Via Optical Solutions, Inc., Taipei (TW)

( * ) Notice: Subject to any disclaimer, the term of this patent is extended or adjusted under 35 U.S.C. 154(b) by 758 days.

(21) Appl. No.: 10/435,787

(22) Filed: May 12, 2003

(65) Prior Publication Data

US 2003/0214331 A1 Nov. 20, 2003

(30) Foreign Application Priority Data

May 15, 2002 (TW) .............................. 91110178 A

(51) Int. Cl.
*H03D 3/24* (2006.01)
(52) U.S. Cl. ...................... 375/376; 375/373; 375/371; 375/354; 375/374; 327/156
(58) Field of Classification Search ................ 375/376, 375/373, 371, 354, 374; 327/156
See application file for complete search history.

(56) References Cited

U.S. PATENT DOCUMENTS 4,390,801 A * 6/1983 Kurata et al. ............... 307/409

OTHER PUBLICATIONS

Ascheid, Gerd, et al., "An All Digital Receiver Architecture For Bandwidth Efficient Transmission at High Data Rates," IEEE Transactions on Communications, vol. 37, No. 8, Aug. 1989, 804-813.
Farrow, C.W., "A Continuously Variable Digital Delay Element," 1988 IEEE, 2641-2645.
Schafer, Ronald W., et al., "A Digital Signal Processing Approach to Interpolation," Proceeding of the IEEE, vol. 61, No. 6, Jun. 1973, 692-702.

* cited by examiner

*Primary Examiner*—Chieh M. Fan
*Assistant Examiner*—Anna Ziskind

(57) ABSTRACT

A phase-locked loop (PLL) device is disclosed. The PLL device includes an interpolator receiving and processing an input signal by an interpolation operation in response to an interpolation timing value to obtain an output signal, a timing error detector in communication with the interpolator for detecting a timing error value of the output signal, a loop filter in communication with the timing error detector for outputting the interpolation timing value to the interpolator in response to the timing error value, and a lock controller in communication with the loop filter for adjusting the interpolation timing value according to a timing quality of the output signal, and providing the adjusted interpolation timing value for the interpolator. A signal generation method for use in the data pick-up device with the aid of the digital phase-locked loop (PLL) device is also disclosed.

9 Claims, 8 Drawing Sheets

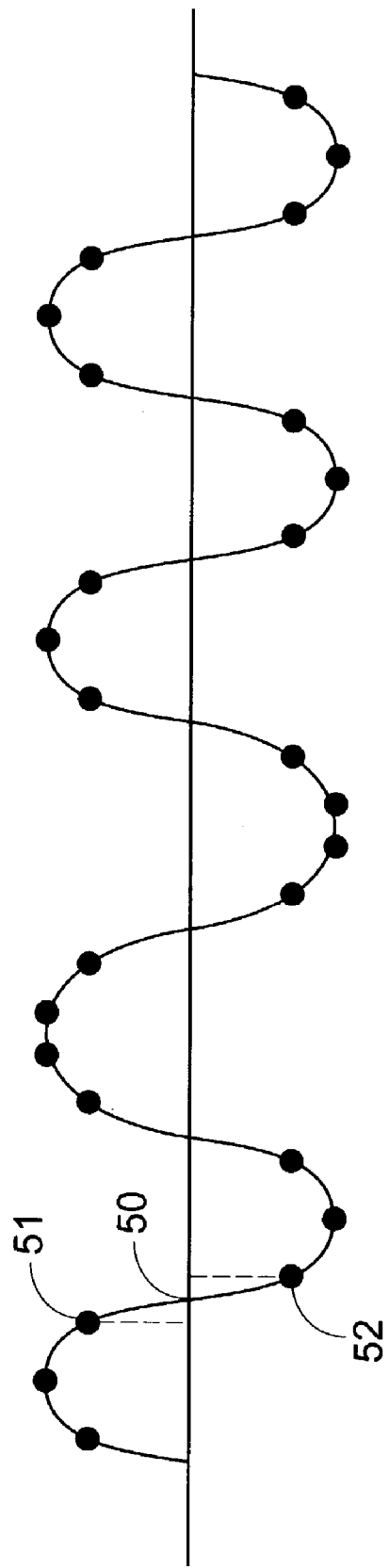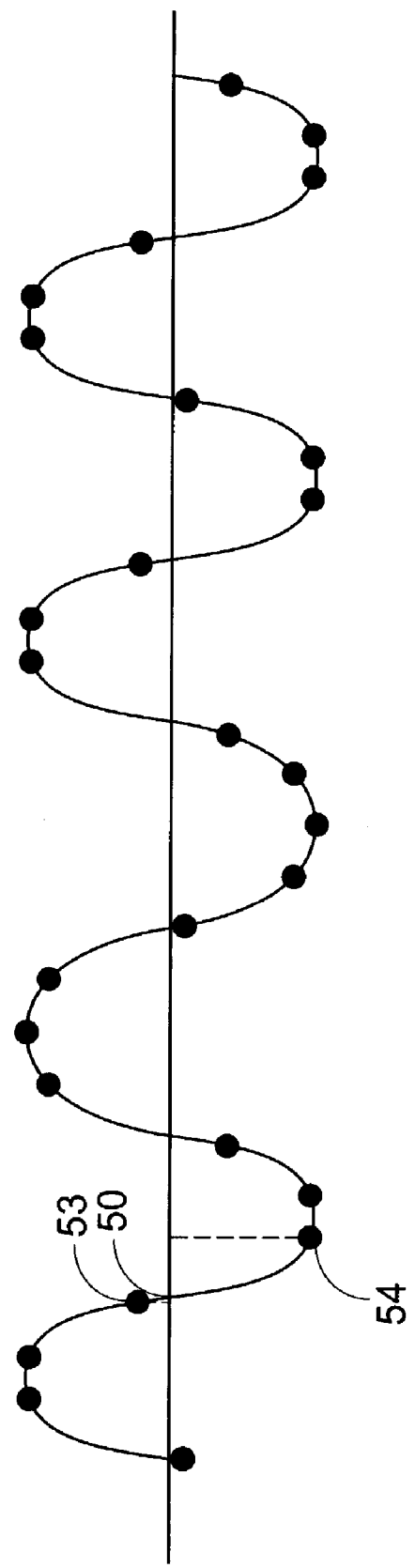

DIGITAL PHASE-LOCKED LOOP DEVICE FOR SYNCHRONIZING SIGNAL AND METHOD FOR GENERATING STABLE SYNCHRONOUS SIGNAL

FIELD OF THE INVENTION

The present invention relates to a digital phase-locked loop (PLL) device, and more particularly to a digital phase-locked loop (PLL) device for use in a data pick-up device. The present invention also relates to a method for generating a signal for use in the data pick-up device with the aid of the digital phase-locked loop (PLL) device.

BACKGROUND OF THE INVENTION

Please refer to FIG. 1A which is a partial functional block diagram illustrating a conventional data pick-up device, e.g. an optical-disk pick-up device. An analog voltage signal from a pick-up head (PUH) is converted into an asynchronous sampled signal by an analog-to-digital converter (ADC) 11. Subsequently, the asynchronous sampled signal is adjusted by an all-digital phase-locked loop (PLL) device 12 to output a synchronous sampled signal. The all-digital PLL device 12 includes an interpolator 121, a timing error detector 122 and a loop filter 123. The interpolator 121 receives and processes the asynchronous sampled signal to output the synchronous sampled signal. The timing error detector 122 detects a timing error value between the synchronous sampled signal and an expected synchronous sampled signal as shown in FIG. 1B. The loop filter 123 outputs an interpolation timing value to the interpolator 121 in response to the change of the timing error value. The interpolator 121 proceeds adjustment according to the interpolation timing value for obtaining a better synchronous sampled signal.

When the analog voltage signal from the pick-up head involves therein significant noise resulting from unexpected factors such as scratch on the disk face, the timing of the asynchronous sampled signal generated from the analog-to-digital converter 11 is extremely unstable. Therefore, it will take a long time for the all-digital PLL 12 to recover the normal condition after the unexpected factors are removed. Thus, the data pick-up performance of the data pick-up device is adversely affected.

Therefore, the purpose of the present invention is to develop a digital phase-locked loop (PLL) device for use in a data pick-up device and a method for generating a stable signal to deal with the above situations encountered in the prior art.

SUMMARY OF THE INVENTION

An object of the present invention is to provide a digital phase-locked loop (PLL) device and a signal generation method for use in a data pick-up device with the digital phase-locked loop (PLL) device, which involve in reduced converging time after the unexpected factors causing the noise are removed.

According to an aspect of the present invention, there is provided a phase-locked loop (PLL) device. The PLL device includes an interpolator receiving and processing an input signal by an interpolation operation in response to an interpolation timing value to obtain an output signal, a timing error detector in communication with the interpolator for detecting a timing error value of the output signal, a loop filter in communication with the timing error detector for outputting the interpolation timing value to the interpolator in response to the timing error value, and a lock controller in communication with the loop filter for adjusting the interpolation timing value according to a timing quality of the output signal, and providing the adjusted interpolation timing value for the interpolator.

In an embodiment, the lock controller includes a lock detector in communication with the loop filter for outputting a restore signal when the timing quality is in a bad condition, and outputting a backup signal when the timing quality is in a good condition, a register electrically connected to an output end of the loop filter for storing a backup copy of the interpolation timing value, and a multiplexer set electrically connected between the register and the loop filter for allowing the backup copy of the interpolation timing value in the register to be updated in response to the backup signal, and allowing the backup copy of the interpolation timing value to be read by the loop filter in response to the restore signal.

In an embodiment, the lock detector includes a timing quality test device comparing a ratio of absolute values of two immediately adjacent output signals respectively leading and following a zero crossing point with a threshold value, and optionally outputting one of an up-counting signal and a down-counting signal according to the comparing result, an up/down counter proceeding an up-counting operation in response to the up-counting signal and a down-counting operation in response to the down-counting signal to produce a counting value, and a comparator set electrically connected to the up/down counter, comparing the counting value of the up/down counter with a backup threshold value and a restore threshold value, outputting the backup signal in response to a first comparison result indicating the counting value crosses the backup threshold value, and outputting the restore signal in response to a second comparison result indicating the counting value crosses the restore threshold value.

For example, the input signal is provided by an analog-to-digital converter, and obtained by a sampling operation on an analog voltage signal. In this case, the input signal is an asynchronous sampled signal and the output signal is a synchronous sampled signal.

In another embodiment, the lock detector includes a timing quality test device comparing a ratio of absolute values of two immediately adjacent output signals respectively leading and following a zero crossing point with a threshold value, and optionally outputting one of an up-counting signal and a down-counting signal according to the comparing result, an up/down counter proceeding an up-counting operation in response to the up-counting signal and a down-counting operation in response to the down-counting signal to produce a counting value, and a comparator set electrically connected to the up/down counter, comparing the counting value of the up/down counter with a backup threshold value and a restore threshold value, outputting the backup signal in response to a first comparison result indicating the counting value crosses the backup threshold value, and outputting the restore signal in response to a second comparison result indicating the counting value crosses the restore threshold value.

According to another aspect of the present invention, a phase-locked loop (PLL) device includes an interpolator receiving and processing an input signal by an interpolation operation in response to an interpolation timing value to obtain an output signal; a timing error detector in communication with said interpolator for detecting a timing error value of said output signal; a lock detector for determining a timing quality of said output signal; and a loop filter in communication with said timing error detector and said lock detector for outputting said interpolation timing value to said interpolator according to said timing error value and said timing quality.

According to another aspect of the present invention, there is provided a signal generation method. The method includes steps of detecting a timing error value associated with an input signal, adjusting an interpolation timing value according to the timing error value, proceeding a frequency backup operation to store the adjusted interpolation timing value when the input signal is in a first quality condition, and proceeding the interpolation operation on the input signal according to the stored interpolation timing value to obtain an output signal when the input signal is in a second quality condition.

Preferably, the signal generation method further includes a step of proceeding the interpolation operation on the input signal according to the last adjusted interpolation timing value to obtain the output signal when the input signal is in the first quality condition.

Preferably, the method further includes steps of detecting the input signal processed by the interpolation operation to determine a quality condition of the input signal, generating a backup signal when the quality condition is the first quality condition, and generating a restore signal when the quality condition is the second quality condition.

Preferably, the quality condition is determined by comparing a ratio of absolute values of two immediately adjacent output signals respectively leading and following a zero crossing point with a threshold value. The first quality condition is determined when the absolute values are close to each other to an extent.

In an embodiment, the method further includes steps of outputting one of an up-counting signal and a down-counting signal to obtain a count value according to a comparing result of a ratio of absolute values of two immediately adjacent output signals at opposite sides of a zero crossing point and a threshold value, outputting the backup signal in response to the cross of the count value over a backup threshold value, and outputting the restore signal in response to the cross of the count value over a restore threshold value.

BRIEF DESCRIPTION OF THE DRAWINGS

The present invention may best be understood through the following description with reference to the accompanying drawings, in which:

FIGS. 5A–5B are schematic waveform diagrams illustrating synchronous sampled signals in a good timing quality and a bad timing quality, respectively;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1A:
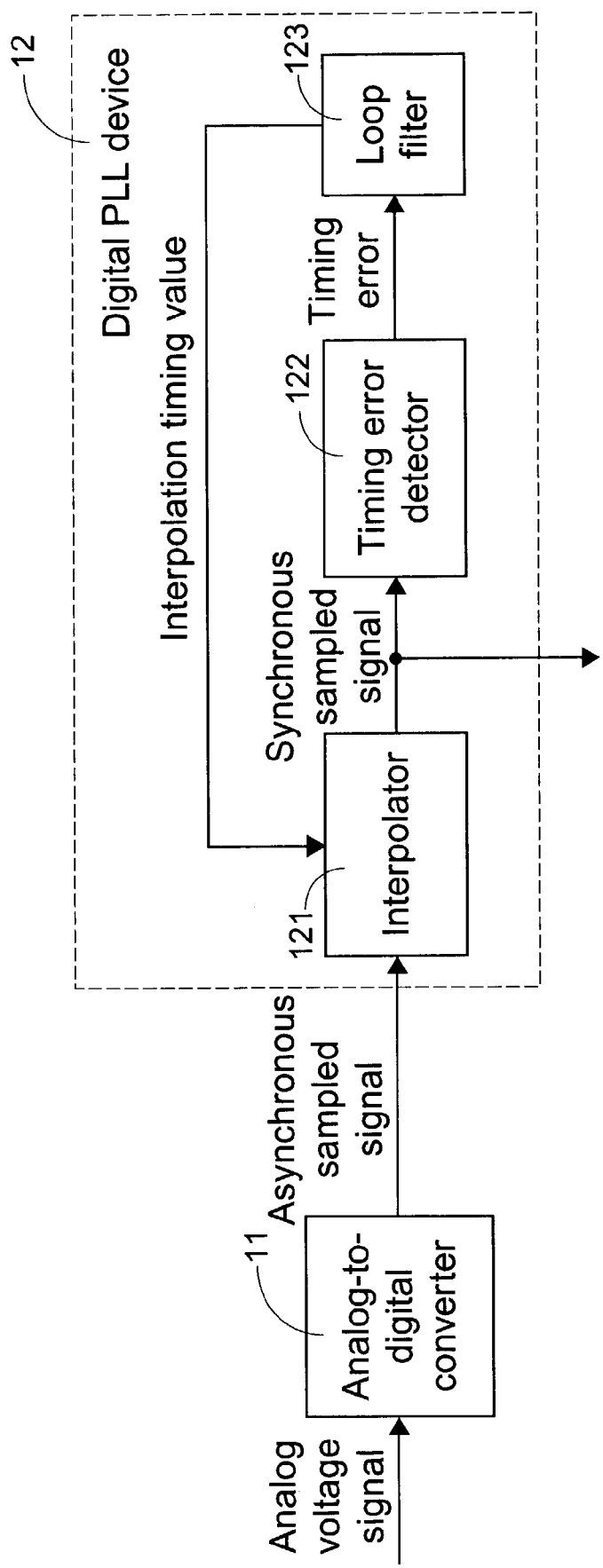
FIG. 1A is a partial functional block diagram of a optical-disk pick-up device illustrating a conventional all-digital PLL device.
Figure 1B:
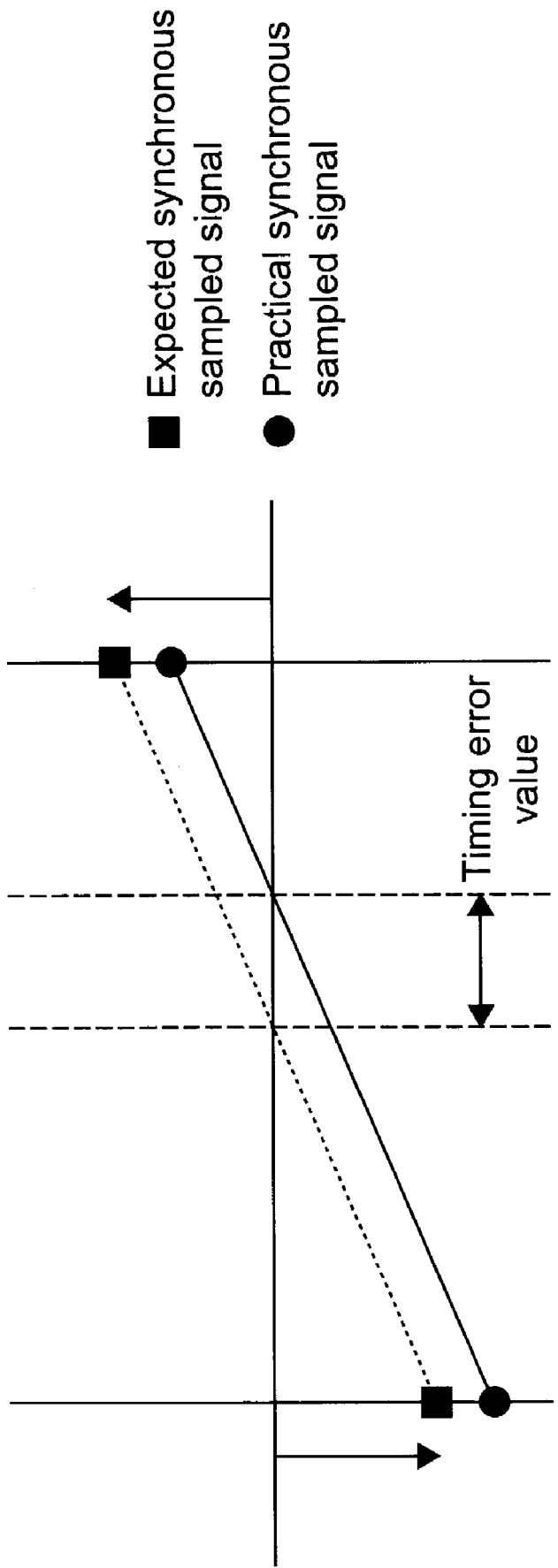
FIG. 1B is a schematic diagram illustrating a timing error value between a practical synchronous sampled signal and an expected synchronous sampled signal.
Figure 2:
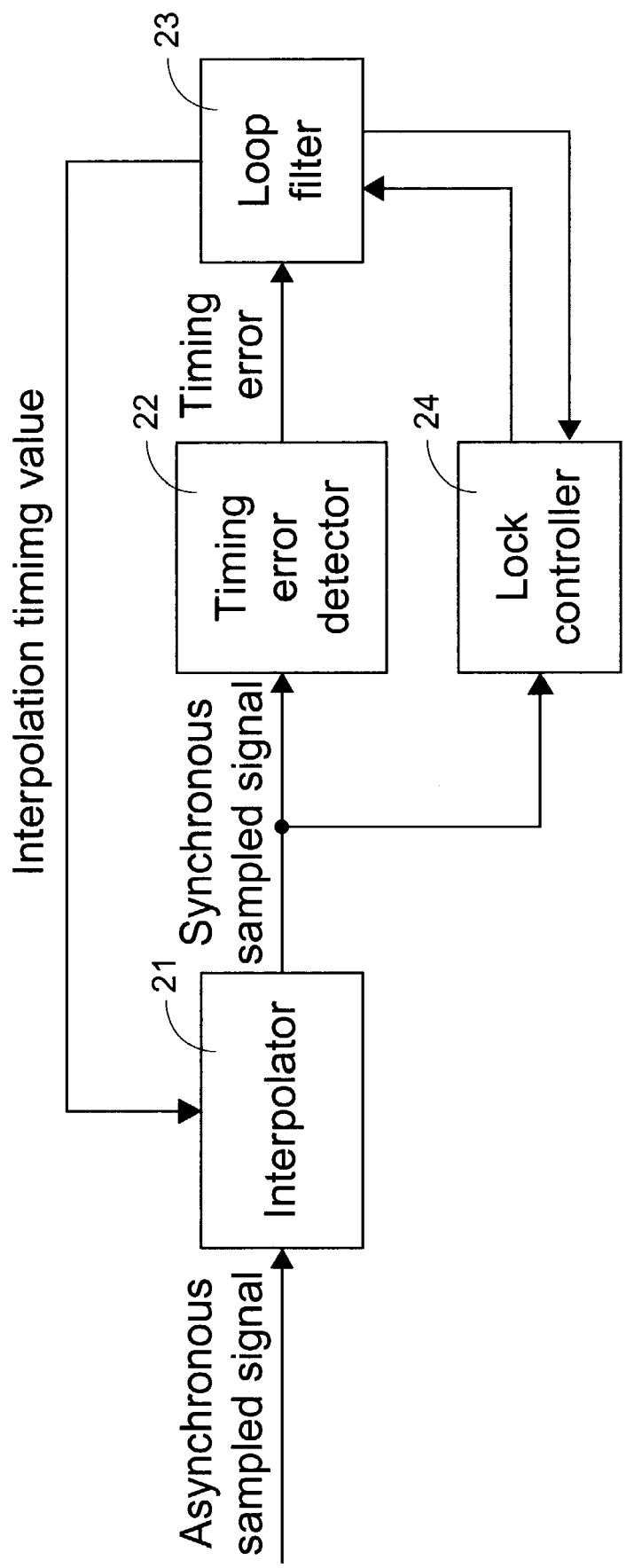
FIG. 2 is a functional block diagram illustrating a preferred embodiment of an all-digital phase-locked loop (PLL) device for use in an optical-disk pick-up device according to the present invention.

FIG. 2 schematically illustrates a preferred embodiment of an all-digital phase-locked loop (PLL) device for use in an optical-disk pick-up device according to the present invention. The all-digital PLL device includes an interpolator 21, a timing error detector 22, a loop filter 23 and a lock controller 24. The interpolator 21 receives and processes an asynchronous sampled signal in response to an interpolation timing value to output a synchronous sampled signal. The timing error detector 22 electrically connected the interpolator 21 detects a timing error value between the synchronous sampled signal and an expected synchronous sampled signal. The loop filter 23 electrically connected to the timing error detector 22 outputs an updated interpolation timing value to the interpolator 21 as a reference according to the timing error value. The lock controller 24 is electrically connected between the interpolator 21 and the loop filter 23 and electrically parallel to the timing error detector 22. The lock controller 24 adjusts the interpolation timing value outputted from the loop filter 23 according to a timing quality of the synchronous sampled signal outputted from the interpolator 21 (detailed descriptions are given later). When the timing quality is in a bad condition, the loop filter 23 keeps outputting a backup copy of the interpolation timing value to the interpolator 21 as a reference.

Figure 3:
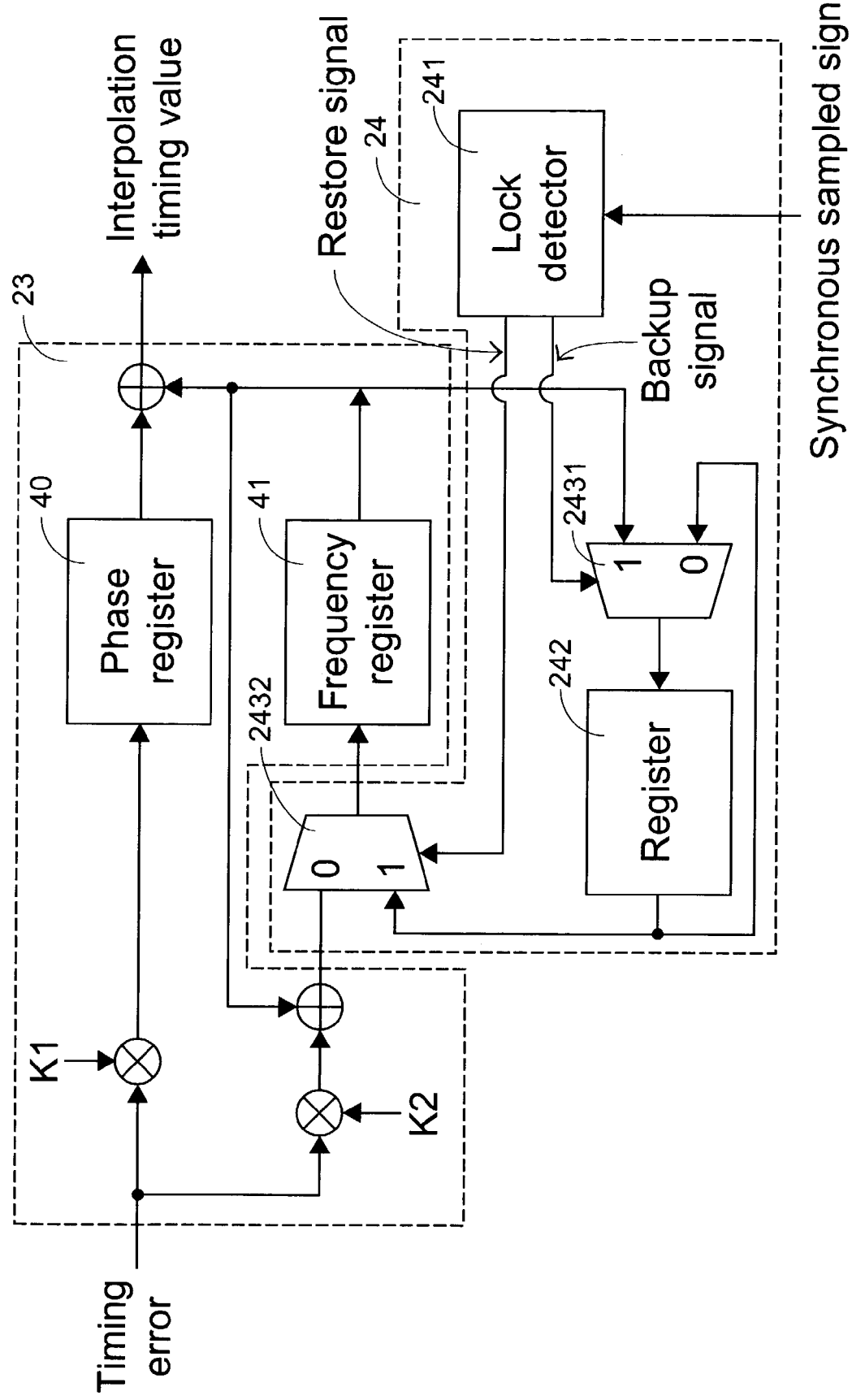
FIG. 3 is a functional block diagram illustrating a preferred embodiment of a loop filter and a lock controller of the all-digital phase-locked loop (PLL) device in FIG. 2.

Please refer to FIG. 3 which is a functional block diagram illustrating a preferred embodiment of a lock controller to cooperate with a loop filter according to the present invention. As shown in FIG. 3, the lock controller 24 includes a lock detector 241, a register 242 and a multiplexer set comprising two multiplexer 2431 and 2432, and the loop filter 23 includes a phase register 40 and a frequency register 41. The register 242 is electrically connected to an output end of the loop filter 23 coming across the multiplexer 2431 for storing a backup copy of the interpolation timing value. The lock detector 241 that comes across the multiplexer 2432 to electrically connect to the loop filter 23 outputs a restore signal or a backup signal according to the timing quality of the synchronous sampled signal. When the timing quality is in a good condition, the lock detector 241 outputs the backup signal. The multiplexer 2431 allows a frequency-related counting value of the interpolation timing value stored in the frequency register 41 of the loop filter 23 to be stored into the register 242 to update the backup copy of the interpolation timing value in response to the backup signal. On the other hand, when the timing quality is in a bad condition, the lock detector 241 outputs the restore signal. The multiplexer 2432 allows the backup copy of the interpolation timing value stored in the register 242 to be outputted by the loop filter 23 in response to the restore signal.

Figure 4:
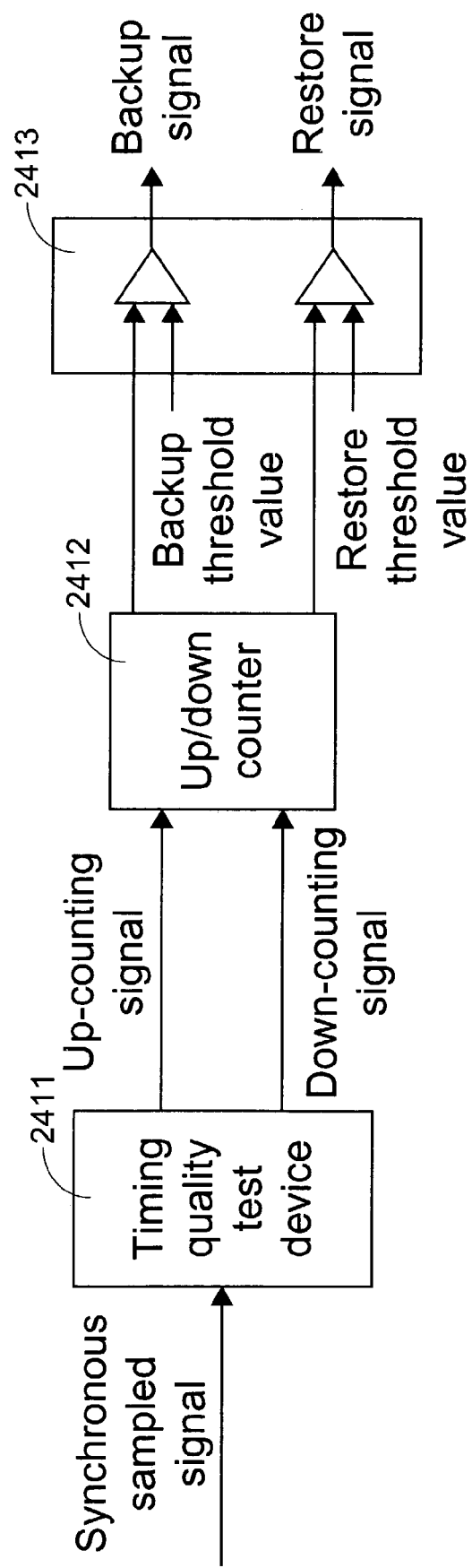
FIG. 4 is a functional block diagram illustrating a preferred embodiment of the lock detector of FIG. 3.

Please refer to FIG. 4 which is a functional block diagram illustrating a preferred embodiment of the lock detector of FIG. 3. The lock detector 241 includes a timing quality test device 2411, an up/down counter 2412 and a comparator set 2413. The timing quality test device 2411 compares a ratio of absolute values of two immediately adjacent synchronous sampled signals respectively leading and following a zero crossing point, which will be described later with reference to FIGS. 5A and 5B, with a threshold value. The timing quality test device 2411 outputs either an up-counting signal or a down-counting signal to the up/down counter 2412 electrically connected thereto according to the comparing result. The up/down counter 2412 proceeds an up-counting operation in response to the up-counting signal and a down-counting operation in response to the down-counting signal so as to realize a counting value. Subsequently, the comparator set 2413 electrically connected to the up/down counter 2412 compares the counting value with a backup threshold value and a restore threshold value and optionally outputs the backup signal or the restore signal according to the comparing result. When the counting value is greater than the backup threshold value, the backup signal is in logic. 1; otherwise, the backup signal is in logic 0. When the backup signal is in logic 1, it represents that the timing quality is in a good condition, so the multiplexer 2431 of FIG. 3 allows the frequency in the register 242 to be updated. On the contrary, when the backup signal is in logic 0, it represents that the timing quality is deteriorated to some extent, and the timing error value obtained in this defect region will be far beyond the expected one. Therefore, the backup operation of the interpolation timing value from the frequency register 41 to the register 242 should be suspended. On the other hand, when the counting value is greater than the restore threshold value, the restore signal is in logic 0; otherwise, the restore signal is in logic 1. When the restore signal is in logic 0, representing the timing quality is in the good condition, the frequency obtained from the loop filter 23 is suitable to be directly used for next interpolation operation. On the contrary, when the restore signal is in logic 1, representing the timing quality is in the bad condition, the current frequency is not suitable to be used, so the backup copy of the frequency stored in the register 242 is used for next interpolation operation. Since the backup copy of the frequency is made when the signal quality is still good, the frequency used for the following interpolation operations would not far away from the normal frequency after the abnormal factor is removed.

Please refer to FIGS. 5A and 5B which show how the timing quality is determined. It is understood that if timing quality is perfect, all the synchronous sampled signals should lie at predetermined levels. Generally, the synchronous sampled signals should be at well symmetric levels. Therefore, two immediately adjacent synchronous sampled signals at opposite sides of the zero crossing point should also be symmetric to each other. Accordingly, by comparing two immediately adjacent synchronous sampled signals at opposite sides of the zero crossing point, the timing quality can be determined. For synchronous sampled signals shown in FIG. 5A, the ratio of absolute values of two immediately adjacent synchronous sampled signals 51 and 52 at opposite sides of the zero crossing point 50 is very close to the ideal value "1". In other words, the synchronous sampled signals are well symmetric. Therefore, the timing quality is determined by the timing quality test device 2411 to be good, and the up-counting signal is outputted to counting accumulatively, as mentioned above. Once the ratio of absolute values of two immediately adjacent synchronous sampled signals 53 and 54 at opposite sides of the zero crossing point 50 is far away from the ideal value "1" as shown in FIG. 5B, the synchronous sampled signals are poorly symmetric. Accordingly, the timing quality test device 2411 will determine the timing quality is in the bad condition and output the down-counting signal to the up/down counter 2412, as mentioned above.

Figure 6A:
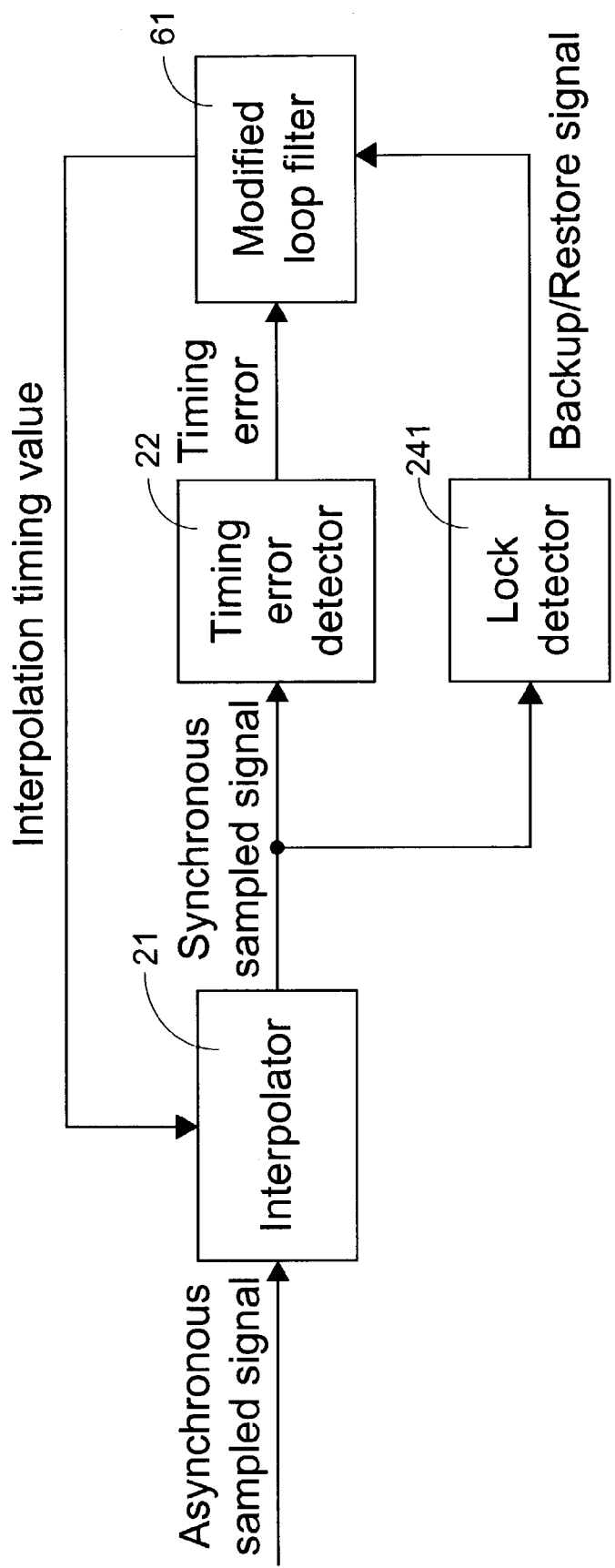
FIG. 6A is a functional block diagram illustrating another preferred embodiment of an all-digital phase-locked loop (PLL) device for use in an optical-disk pick-up device according to the present invention.
Figure 6B:
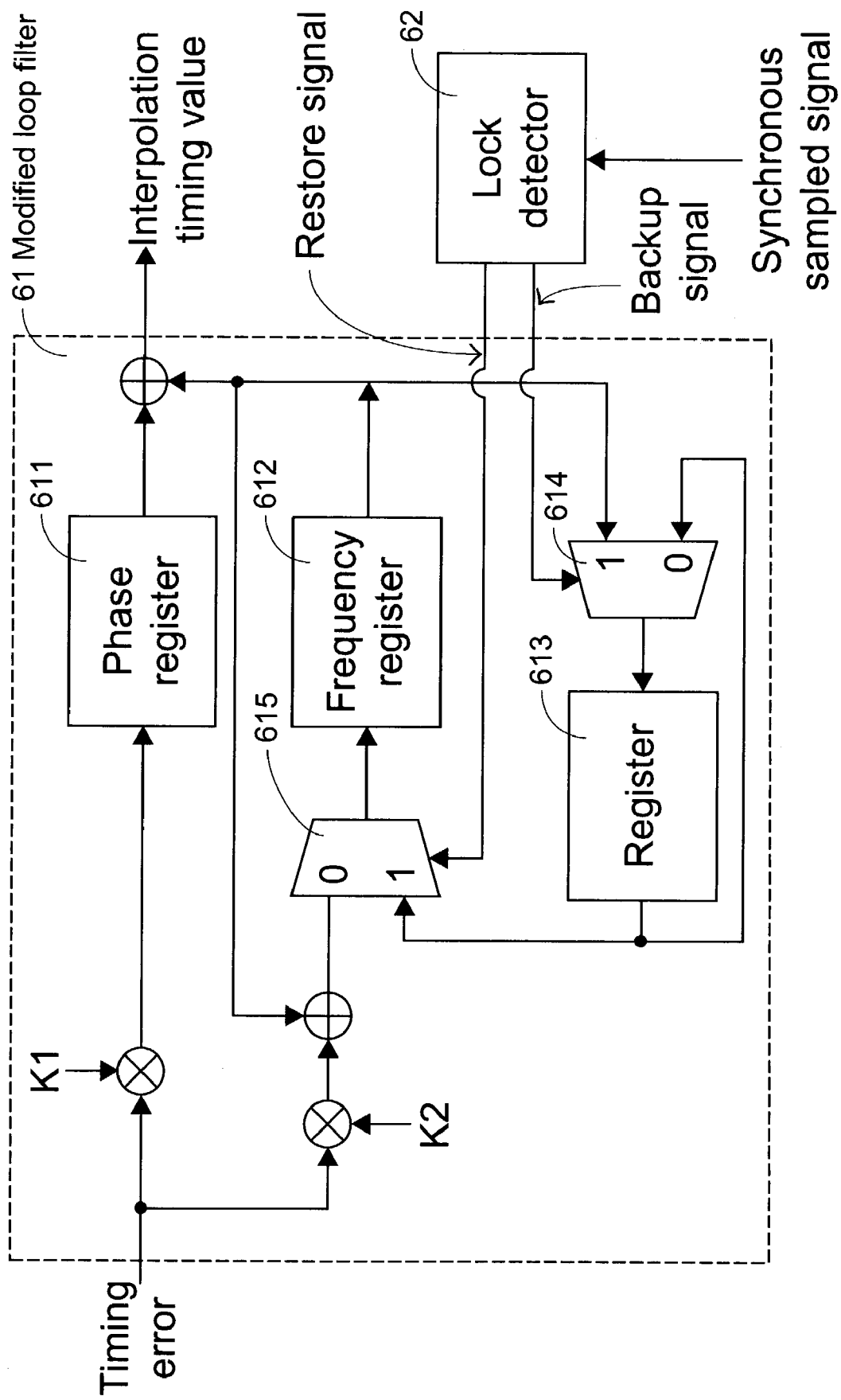
FIG. 6B is a functional block diagram illustrating a preferred embodiment of a modified loop filter and a lock detector of the all-digital PLL device in FIG. 6A.

Please refer to FIG. 6A which is a functional block diagram illustrating another preferred embodiment of an all-digital phase-locked loop (PLL) device for use in an optical-disk pick-up device according to the present invention. The function and structure of the interpolation 21 and the timing error detector 22 in FIG. 6A are similar to those in FIG. 2, but a modified loop filter 61 is used instead of the loop filter 23. As shown in FIG. 6B, the modified loop filter 61 includes a phase register 611, a frequency register 612, a register 613 and two multiplexers 614 and 615. The modified loop filter 61 cooperates with a lock detector 62 to achieve the functions of the loop filter 23 and the lock controller 24.

As shown in FIG. 6B, the register 613 stores therein a backup copy of the interpolation timing value. The lock detector 62 outputs a restore signal or a backup signal according to the timing quality of the synchronous sampled signal. When the timing quality is in a good condition, the lock detector 62 outputs the backup signal. The multiplexer 614 allows a frequency-related counting value of the interpolation timing value stored in the frequency register 612 to be stored into the register 613 to update the backup copy of the interpolation timing value in response to the backup signal. On the other hand, when the timing quality is in a bad condition, the lock detector 62 outputs the restore signal. The multiplexer 615 allows the backup copy of the interpolation timing value stored in the register 613 to be outputted in response to the restore signal. The function of the lock detector 62 is similar to the lock detector 241 in FIG. 3, and includes a timing quality test device, an up/down counter and a comparator set, similar to those shown in FIG. 4. The timing quality test device compares a ratio of absolute values of two immediately adjacent synchronous sampled signals respectively leading and following a zero crossing point with a threshold value. The timing quality test device outputs either an up-counting signal or a down-counting signal to the up/down counter electrically connected thereto according to the comparing result. The up/down counter proceeds an up-counting operation in response to the up-counting signal and a down-counting operation in response to the down-counting signal so as to realize a counting value. Subsequently, the comparator set compares the counting value with a backup threshold value and a restore threshold value and optionally outputs the backup signal or the restore signal according to the comparing result. When the counting value is greater than the backup threshold value, the backup signal is in logic 1; otherwise, the backup signal is in logic 0. When the backup signal is in logic 1, it represents that the timing quality is in a good condition, so the multiplexer 614 of FIG. 6B allows the frequency in the register 613 to be updated. On the contrary, when the backup signal is in logic 0, it represents that the timing quality is deteriorated to some extent, and the timing error value obtained in this defect region will be far beyond the expected one. Therefore, the backup operation of the interpolation timing value from the frequency register 612 to the register 613 should be suspended. On the other hand, when the counting value is greater than the restore threshold value, the restore signal is in logic 0; otherwise, the restore signal is in logic 1. When the restore signal is in logic 0, representing the timing quality is in the good condition, the frequency obtained from the modified loop filter 61 is suitable to be directly used for next interpolation operation. On the contrary, when the restore signal is in logic 1, representing the timing quality is in the bad condition, the current frequency is not suitable to be used, so the backup copy of the frequency stored in the register 613 is used for next interpolation operation. Since the backup copy of the frequency is made when the signal quality is still good, the frequency used for the following interpolation operations would not far away from the normal frequency after the abnormal factor is removed.

From the above description, when the analog voltage signal from the pick-up head involves therein significant noise resulting from unexpected factors such as scratch on the disk face, the all-digital PLL device according to the present invention can quickly restore the backup copy of the interpolation timing value obtained in the good condition for next interpolation operation so as to efficiently reduce the recovering time after the unexpected factors are removed. Further, the data pick-up performance of the data pick-up device can be improved. Moreover, the disclosed digital phase-locked loop (PLL) device can be established into any device for reading data from a storage medium. For example, any optical reproducing device used to reproduce information from a disc can employ the embodiment for reading data. The optical reproducing device can be a compact disk-read only memory (CD-ROM) drive, a digital versatile disk-read only memory (DVD-ROM) drive, a compact disk-rewritable (CD-RW) drive, a digital versatile disk-recordable (DVD-R) drive, a digital versatile disk-rewritable (DVD-RW) drive, or even a digital versatile disk-random access memory (DVD-RAM) drive.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A phase-locked loop (PLL) device comprising:
   an interpolator receiving and processing an input signal by an interpolation operation in response to an interpolation timing value to obtain an output signal;
   a timing error detector in communication with said interpolator for detecting a timing error value of said output signal;
   a loop filter in communication with said timing error detector for outputting said interpolation timing value to said interpolator in response to said timing error value; and
   a lock controller for receiving and adjusting said interpolation timing value from said loop filter according to a timing quality of said output signal, and providing said adjusted interpolation timing value for said loop filter to be outputted to said interpolator, said lock controller comprising:
      a register for storing a backup copy of said interpolation timing value; and
      a multiplexer set electrically coupled between said register and said loop filter for allowing said backup copy of said interpolation timing value in said register to be updated when said timing quality is in a good condition, and allowing said backup copy of said interpolation timing value to be read by said loop filter when said timing quality is in a bad condition.

2. The PLL device according to claim 1 wherein said lock controller further includes:
   a lock detector in communication with said loop filter for outputting a restore signal when said timing quality is in the bad condition, and outputting a backup signal when said timing quality is in the good condition.

3. The PLL device according to claim 2 wherein said lock detector includes:
   a timing quality test device comparing a ratio of absolute values of two immediately adjacent output signals respectively leading and following a zero crossing point with a threshold value, and optionally outputting one of an up-counting signal and a down-counting signal according to the comparing result;
   an up/down counter proceeding an up-counting operation in response to said up-counting signal and a down-counting operation in response to said down-counting signal to produce a counting value; and
   a comparator set electrically connected to said up/down counter, comparing said counting value of said up/down counter with a backup threshold value and a restore threshold value, outputting said backup signal in response to a first comparison result indicating said counting value crosses said backup threshold value, and outputting said restore signal in response to a second comparison result indicating said counting value crosses said restore threshold value.

4. The PLL device according to claim 1 wherein said input signal is an asynchronous sampled signal and said output signal is a synchronous sampled signal.

5. A phase-locked loop (PLL) device comprising:
   an interpolator receiving and processing an input signal by an interpolation operation in response to an interpolation timing value to obtain an output signal;
   a timing error detector in communication with said interpolator for detecting a timing error value of said output signal;
   a lock detector for determining a timing quality of said output signal, comprising:
      a timing quality test device comparing a ratio of absolute values of two immediately adjacent output signals respectively leading and following a zero crossing point with a threshold value, and optionally outputting one of an up-counting signal and a down-counting signal according to the comparing result;
      an up/down counter performing an up-counting operation in response to said up-counting signal and a down-counting operation in response to said down-counting signal to produce a counting value;
      a comparator set electrically connected to said up/down counter, comparing said counting value of said up/down counter with a backup threshold value and a restore threshold value, outputting a backup signal in response to a first comparison result indicating said counting value crosses said backup threshold value, and outputting a restore signal in response to a second comparison result indicating said counting value crosses said restore threshold value; and
   a loop filter for outputting said interpolation timing value to said interpolator according to said timing error value received from said timing error detector and said timing quality realized from said lock detector.

6. The PLL device according to claim 5 wherein said loop filter includes:

a register for storing a backup copy of said interpolation timing value; and a multiplexer set electrically coupled to said register for allowing said backup copy of said interpolation timing value in said register to be updated in response to said backup signal, and allowing said backup copy of said interpolation timing value to be read by said interpolator in response to said restore signal.

7. A signal generation method, comprising steps of:

detecting a timing error value associated with an input signal;

adjusting an interpolation timing value according to said timing error value;

performing a frequency backup operation to generate a backup signal to store said adjusted interpolation timing value when said input signal is in a first quality condition;

performing an interpolation operation to generate a restore signal on said input signal according to said stored interpolation timing value to obtain an output signal when said input signal is in a second quality condition; and comparing a ratio of absolute values of two immediately adjacent output signals respectively leading and following a zero crossing point with a threshold value to determine whether said input signal is in said first quality condition or said second quality condition.

8. The method according to claim 7 wherein said first quality condition is determined when said absolute values are close to each other to an extent.

9. The method according to claim 7 further comprising steps of:

outputting one of an up-counting signal and a down-counting signal to obtain a count value according to the comparing result of said two immediately adjacent output signals;

outputting said backup signal in response to the cross of said count value over a backup threshold value; and outputting said restore signal in response to the cross of said count value over a restore threshold value.

* * * * *